United States Patent [19]

Van Orsdel

[11] Patent Number: 4,636,637

[45] Date of Patent: Jan. 13, 1987

[54] METHOD AND APPARATUS FOR DETECTING MOTION THROUGH A TRANSPARENT ENCLOSURE, WITH SPURIOUS INFORMATION DETECTING AND COMPENSATING MEANS

[76] Inventor: James Van Orsdel, 1917 Commonwealth Ave., Charlotte, N.C. 28205

[21] Appl. No.: 791,100

[22] Filed: Oct. 24, 1985

[51] Int. Cl.[4] .............................................. G01D 5/34
[52] U.S. Cl. ........................... 250/231 SE; 340/870.29
[58] Field of Search ......................... 250/231 SE, 227; 340/870.02, 870.28, 870.29, 347; 377/53; 324/142

[56] References Cited

U.S. PATENT DOCUMENTS

| | | | |
|---|---|---|---|
| 4,129,862 | 12/1978 | Kaplan et al. | 250/231 SE |
| 4,194,184 | 3/1980 | Hartmann et al. | 250/231 SE |
| 4,204,115 | 5/1980 | Boldridge, Jr. | 340/870.29 |
| 4,276,644 | 6/1981 | DeWitte | 340/870.02 |
| 4,301,444 | 11/1981 | Bruckert et al. | 340/870.02 |

Primary Examiner—David C. Nelms
Assistant Examiner—William L. Oen
Attorney, Agent, or Firm—W. Thad Adams, III

[57] ABSTRACT

An electro-optical encoder is disclosed of the type used for reading utility meters. The encoder includes at least one light source for directing light onto the edge of the rotating disk of the utility meter. At least one sensor receives information reflected from the metered disk in pulse form upon sensing the calibration mark on the disk. A compensation circuit is connected to the sensor for detecting spurious information reflected from the disk and compensating for the spurious information to produce an accurate signal reflecting metered product usage for delivery to a final output. The compensation circuit includes a counter for being set to an integer corresponding to an empirically determined number of pulses sensed by the sensor during a single rotation of the meter disk. The counter counts down to one and then transmits downstream a single pulse representing one revolution of the meter disk and is then reset.

15 Claims, 4 Drawing Figures

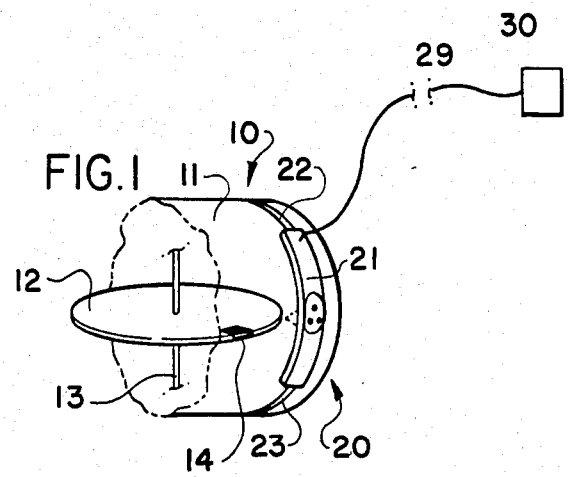
FIG. 1
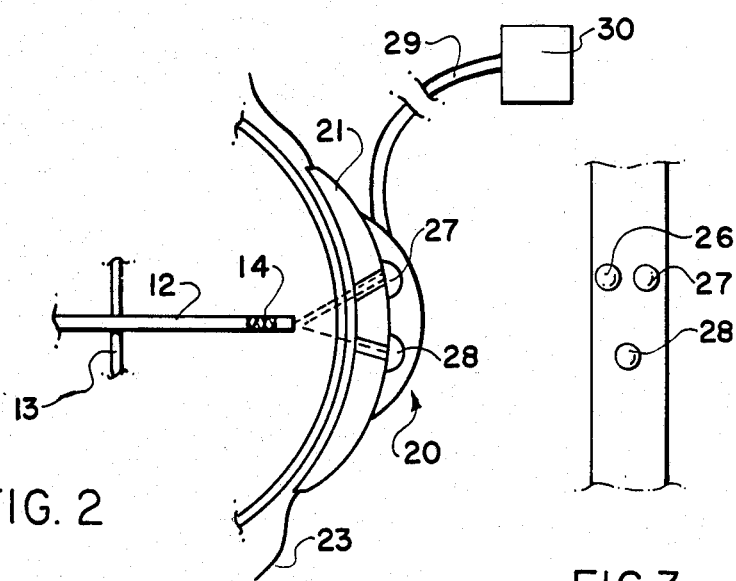
FIG. 2
FIG. 3

METHOD AND APPARATUS FOR DETECTING MOTION THROUGH A TRANSPARENT ENCLOSURE, WITH SPURIOUS INFORMATION DETECTING AND COMPENSATING MEANS

TECHNICAL FIELD AND BACKGROUND OF THE INVENTION

This invention relates to a method and apparatus for detecting motion through a transparent enclosure, such as an electric utility meter. The method and apparatus includes a means of detecting and compensating for spurious information which might be generated as a result of defects or anomalies in the utility meter itself.

Specifically, the invention includes at least one light emitting diode (LED) which is directed onto the rotating disk of an electric utility meter. A photosensor is positioned to detect light reflected from the rotating disk. Each time the calibration mark on the disk rotates past the LED, the photosensor senses a pulse. By counting the pulses, the amount of electric current used during a given period of time can easily be calculated. Devices which operate in the manner described immediately above are known. For example, the Boldridge, Jr. U.S. Pat. No. 4,204,115, includes two spherical lenses positioned in the plane of the disk with an optical fiber cable coupling visible light from an incandescent source to one of the spherical lenses to focus light on the periphery of the disk and a second fiber optical cable transmitting light collected by the second spherical lense focused on the periphery of the disk to a photoresistor circuit. The Krogh et al U.S. Pat. No. 4,491,826, discloses an incremental digital converter for converting two-phase displaced signals of a pulse generator. The signals represent the position and direction of an object moved in two opposite directions. One of the functions of the digital converter is to compensate for errors which result from movement of the object in the wrong direction.

The Marshall U.S. Pat. No. 4,321,531, discloses a direction sensitive pulse initiator for a watt meter. A pair of sensors senses the presence of an indicator portion or portions on the rotating disk. Electrical signals are produced which are decoded to initiate clockwise rotation pulses and/or counterclockwise rotation pulses.

Prior art patents have also recognized that simply counting the number of times the calibration mark rotates past a sensing device is more difficult in application than in theory. One of the primary reasons for problems in this area is the fact that electric utility meters are usually inexpensively made and are subject to a variety of misadjustments and calibration errors. In addition, utility meters are subject to a substantial amount of abuse. The rotating disk portion of the meter may be bent or warped by uneven heating or damage during installation, service or repair. Furthermore, since these utility meters are often placed on the outside of buildings, corrosion and pitting of the metered disk can occasionally result. Furthermore, the disks are sometimes loosely mounted which can cause wobbles as the disk rotates. These defects will often cause reflections or gaps in reflections which are picked up by a sensor and, if not compensated for in some way, indicate that more revolutions have occurred than is actually the case. It does not appear that the prior art has recognized this particular problem, as such. Specifically, the prior art does not appear to acknowledge that while such defects are common, they are almost always regular, i.e., the same spurious pulses occur during each and every rotation of the disk. This principle has now been established and, accordingly, this application describes a method and apparatus for inexpensively detecting and compensating for such errors. Since it has now been determined that errors of the type described above appear regularly, it is possible to visually observe the rotation of the disk and determine if more than one pulse is generated during each rotation. For example, if three pulses are obtained during each rotation, one of these pulses is obviously caused by the calibration mark on the disk. The other two pulses might be caused by a number of error conditions, some of which are suggested above. By providing a counter and setting number "3" on the counter, the counter can be made to count down each time it senses a pulse. Each time the number "1" is reached, the counter outputs a signal which corresponds to a single full rotation of the meter disk. In this way, the meter disk need not be replaced or the error conditions otherwise corrected. It is enough to simply recognize that the error conditions are present and to compensate for them.

SUMMARY OF THE INVENTION

Therefore, it is an object of the invention to provide an electro-optical encoder for reading utility meters which include a rotating meter disk, wherein spurious information reflected from the meter disk is detected and eliminated.

It is another object of the invention to provide an electro-optical encoder which itself is inexpensive and does not require adjustment or replacement of a defective rotating disk of the utility meter.

It is yet another object of the present invention to provide a method of detecting spurious information reflected from a rotating meter disk of a utility meter and compensating for the spurious information to produce an accurate signal reflecting metered product usage for delivery to a final output.

These and other objects of the present invention are achieved in the preferred embodiment disclosed below by providing an electro-optical encoder of the type used for reading utility meters which includes a rotating meter disk having a calibration mark thereon. The encoder comprises at least one light source for directing light onto the circumferential periphery of the rotating meter disk. At least one sensor is provided for receiving information reflected from the meter disk in pulse form upon sensing the calibration mark.

A compensation circuit is operatively connected to the sensor for detecting spurious information reflected from the meter disk and compensating for the spurious information to produce an accurate signal reflecting metered product usage. The compensation circuit includes a counter operatively connected to the sensor for being set to an integer corresponding to an empirically determined number of pulses sensed by the sensor during a single rotation of the meter disk, wherein at least one of the pulses is genuine and the remainder of the pulses are spurious.

The counter includes means for counting down to "one" and then transmitting downstream a single pulse representing one revolution of the meter disk. Means are also provided for resetting the counting circuit to the integer and repeating the counting down function during each successive rotation of the meter disk.

Preferably the encoder includes a pulse shaper for transforming input pulses of various signal strength into shaped pulses having a pure high-low configuration satisfactory for downstream counting.

According to another preferred embodiment of the invention, the encoder includes a divider circuit downstream of the counter for reducing the number of pulses by an integral factor to reduce the downstream duty cycle frequency of the encoder.

According to another embodiment of the invention, the encoder includes means for transmitting the pulsed output to a remote location for storage.

Preferably, the light source and sensor of the encoder are housed in a sensor housing releasably secured around the periphery of the cover of the utility meter.

The method of detecting spurious information reflected from a rotating meter disk of a utility meter and compensating for the spurious information comprises the steps of directing light from a light source onto the circumferential periphery of the rotating disk having a calibration mark. Light pulses reflected from the meter disk are sensed and the number of pulses sensed by the sensor during a single rotation of the meter disk is empirically determined. A counting step takes place wherein the integer is "counted down" to "one", whereupon a single electrical pulse is transmitted downstream and represents one revolution of the meter disk. The steps are repeated during each successive rotation of the meter disk.

According to the preferred embodiment of the method according to the invention, the pulse is shaped before the step of counting down from the integer to "one" in order to transform input pulses of various signal strengths into shaped pulses having a pure high-low configuration satisfactory for the counting step.

BRIEF DESCRIPTION OF THE DRAWINGS

FIG. 1 is a representational view of the rotating disk and glass cover portion of an electric utility meter with the apparatus according to the invention in place thereon;

FIG. 2 is an enlarged vertical cross-sectional view according to FIG. 1;

FIG. 3 is a partial, vertical front elevational view of the light source and sensor according to the invention.

DESCRIPTION OF THE PREFERRED EMBODIMENT

Figure 4:
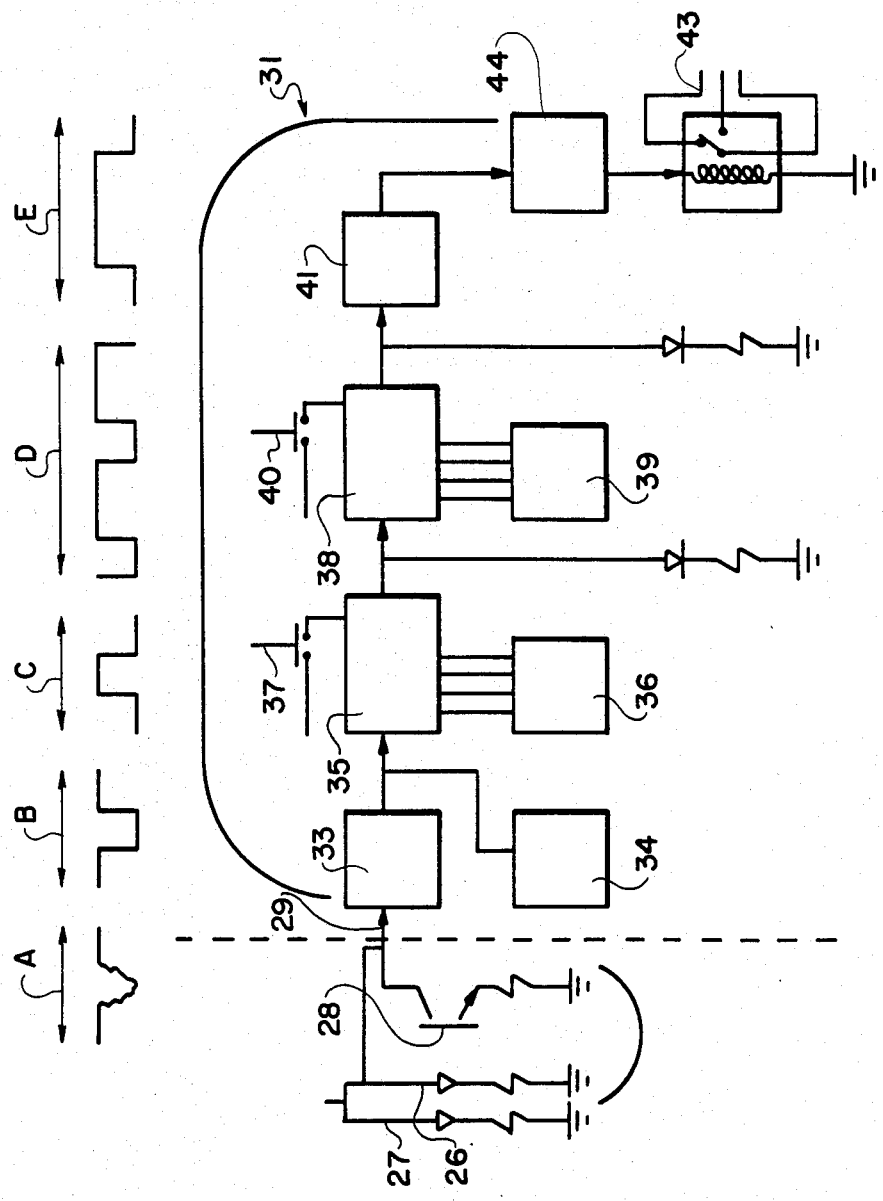
FIG. 4 is a schematic of the circuit of the apparatus according to the present invention.

Referring now to specifically to the drawings, an electric utility meter of the general type with which the invention according to this application is shown generally at reference numeral 10. The meter 10 includes a transparent glass cover 11 within which the working parts of the meter are enclosed. Since meter 10 itself is not a part of the invention, the various mechanical parts of the meter are not illustrated except for the rotating meter disk 12, which rotates on a suitably driven shaft 13 by a drive mechanism (not shown). A calibration mark 14 on meter disk 12 is required by law and permits independent verification and calibration of the accuracy of the meter.

The apparatus according to the invention is contained in two distinct housings—a sensor housing 20 and a counter housing 30.

Sensor housing 20 preferably comprises a small, molded plastic case 21, having straps 22 and 23 secured, respectively, to opposite sides of case 21. Straps 22 and 23 may comprise any suitable means for securing case 21 around the cylindrical shape of meter 10. It has been found that straps having hook and loop fasteners thereon perform suitably due to the very light weight of case 21. By hook and loop fasteners is meant complementary patches, with one patch having a loose, fibrous non-woven material thereon and the other patch having a multitude of erect, semi-rigid hooks which releasably grip the non-woven fibrous material.

Referring now to FIG. 3, two light emitting diodes (LEDs) 26 and 27 are positioned on the inner, concave face of face 21. LEDs 26 and 27 are preferably positioned generally somewhat above the plane of disk 12 and are aimed slightly downward so that the light emitted from LEDs 26 and 27 fall directly on the circumferential periphery of disk 12. LEDs 26 and 27 are of the type which emit infrared radiation, that is, the portion of the electromagnetic spectrum of radiation extending from the limit of the red end of the visible spectrum to the microwave region (730 nanometers to about 1 millimeter in wavelength). By providing two LEDs 26 and 27, allows two streams of light to actually (find), by angle means, the edge of the disk 12, no matter the distance from the glass 11. Positioned below and between LEDs 26 and 27 on the concave face of face 21 is an infrared sensor 28. LEDs 26 and 27 are so positioned in relation to infrared sensor 28 that they are disposed symmetrically on opposite sides of the extended plane of disk 12 so that light beamed onto the edge of rotating disk 12 by LEDs 26 and 27 is reflected at an angle directly onto infrared sensor 28.

Sensor housing 20 is connected to counter housing 30 by means of a suitable electrical cable 29. Ordinarily, counter housing 30 would be mounted on the exterior wall of a building relatively near the meter, but could be located at any other convenient location or even incorporated into sensor housing 20.

Referring now to FIG. 4, a compensation circuit 31 contained within counter housing 30 is shown. Light reflected from disk 12 (see FIG. 1) and sensed by infrared sensor 28 is delivered to a pulse shaper 33 (IC 4538). Usually, the pulse sensed by infrared sensor 28 is an irregular pulse and may have a variety of frequencies and/or amplitudes. Representationally the pulse may resemble that shown at "A." Pulse shaper 33 transforms input pulses of various signal strengths into shaped pulses having a high-low configuration satisfactory for counting in the downstream processes. After shaping, the pulse may representationally resemble that shown at "B."

An amp meter 34 is connected into the circuit downstream of pulse shaper 33 and indicates a maximum value when light is reflected from disk 12 and a minimum value when no light is reflected from disk 12. The shaped pulse is delivered to a down counter 35 (IC4510). Down counter 35 is controlled by a switch 36 which sets the integer from which the counter begins counting down. In the example described in this application, it is assumed that the disk, in addition to the calibration mark 14, contains two defects or irregularities which cause two spurious pulses to be received by infrared detector 28. As described above, these spurious pulses may be caused by corrosion, pitting, wobble in the rotation of disk 12 or a number of other reasons. These anomalies are determined visually by watching the disk 12 rotate and noting the pulses delivered to amp meter 34. Assuming that three pulses are received for each rotation of disk 12, counter 35 is set by means of switch 36 to 3. Down counter 35 receives pulses from pulse shaper 33 and goes "high" when the number of input pulses from pulse shaper 33 equals the number preset by switch 36. At this point, a pulse "C" is output from down counter 35. A reset button 37 is provided to reset counter 35 when desired.

According to a preferred embodiment of the invention, a second down counter 38 (IC4510) is provided downstream of counter 35. Counter 38 is also controlled by a switch 39 and includes a reset button 40. Counter 38 is useful in that the output of circuit 31 is conveyed by means of communication lines to a central computer (not shown) which at an appropriate time generates a total of the output, computes the bill and sends the bill to the utility customer. Since the computer may be simultaneously receiving input signals from many hundreds or even thousands of circuits 31, it is desirable to reduce the frequency with which each circuit delivers information to the computer. This enables the computer to monitor many more circuits 31 than would otherwise be required. Therefore, counter 38 can be used to reduce the number of pulses by an integral factor to reduce the downstream duty cycle frequency of the encoder into the computer. For example, switch 39 may be set to 10. Therefore, counter 38 will deliver one pulse "D" for each ten pulses "C" received from counter 35.

A reset button 40 is provided to reset counter 38 when desired.

A flip-flop circuit (IC 4013) receives output from the second counter 38 and provides a 50% duty cycle to reduce the number of transitions of the output from counter 38 and also lengthens the signal which is output from flip-flop circuit 41 to a mechanical relay 43 in order to provide enough time to secure positive activation of the mechanical relay. The output signal from flip-flop circuit 41 also activates a relay driver 44 which provides more current to activate electro-mechanical relay 43.

Because of the construction described above, the device is easy and relatively inexpensive to manufacture. Furthermore, it can be quickly attached to the utility meter without removing the glass cover or making any adjustments whatsoever to the meter mechanism. Adjustments can be made immediately to insure that light emitted from LEDs 26 and 27 is properly reflected and received by sensor 28. Furthermore, it will be appreciated that a number of variations in construction features are possible to account for varying circumstances.

A method and apparatus for detecting motion through a transparent enclosure, with spurious information detecting a compensating means is described above. Various details of the invention may be changed without departing from its scope. Furthermore, the foregoing description of the preferred embodiment according to the present invention is provided for the purpose of illustration only and not for the purpose of limitation—the invention being defined by the claims.

I claim:

1. An electro-optical encoder of the type used for reading utility meters which include a rotating meter disk having a calibration mark thereon, said encoder comprising at least one light source for directing light onto the circumferential periphery of the rotating meter disk; at least one sensor for receiving information reflected from the meter disk in pulse form upon sensing the calibration mark; a compensation circuit operatively connected to said sensor for detecting spurious information reflected from the meter disk and compensating for the spurious information to produce an accurate signal reflecting metered product usage for delivery to a final output, said compensation circuit comprising; a counter operatively connected to said sensor for being set to an integer corresponding to an empirically determined number of pulses sensed by the sensor during a single rotation of the meter disk, wherein at least one of such pulses is genuine and the remainder spurious, said counter having means for counting down to "one" and then transmitting downstream a single pulse representing one revolution of the meter disk, and means for then resetting the counting circuit to the integer and repeating the counting down function during each successive rotation of said meter disk.

2. An electro-optical encoder according to claim 1, including a pulse shaper downstream of said sensor and upstream of said counter for transforming input pulses of various signal strength into shaped pulses having a pure high-low configuration satisfactory for counting.

3. An electro-optical encoder according to claim 1 or 2, wherein said encoder includes a divider circuit downstream from said counter for reducing the number of pulses by an integral factor to reduce the downstream duty cycle frequency of the encoder.

4. An electro-optical encoder according to claim 3, wherein said encoder includes means for transmitting the pulse output to a remote location for storage.

5. An electro-optical encoder according to claim 3, and including a mechanical relay upstream from and in series connection with said final output to electrically isolate said encoder from the final output of the circuit.

6. An electro-optical encoder according to claim 5, and including a flip-flop circuit for lengthening the pulse to facilitate reliable activation of said mechanical relay.

7. An electro-optical encoder according to claim 6, wherein said light source and said sensor are housed in a sensor housing adapted to be releasably secured around the periphery of the cover of the utility meter with said light source and said sensor in light transmission in relation to the meter disk.

8. An electro-optical encoder according to claim 7, wherein said light source comprises two LEDs aimed at the periphery of the meter disk.

9. An electro-optical encoder according to claim 8, wherein said sensor includes an infrared receiver aimed at the same point on the periphery of said meter disk as said two LEDs.

10. An electro-optical encoder according to claim 7, wherein said counter is housed in a counter housing connected by a light source/sensor transmission cable and adapted for being mounted remote from said sensor housing and utility meter.

11. A method of detecting spurious information reflected from a rotating meter disk of a utility meter and compensating for the spurious information to produce an accurate signal reflecting metered product usage for delivery to a final output, said method comprising:

a. directing light from a light source onto the circumferential periphery of the rotating meter disk having a calibration mark thereon;

b. sensing information in the form of light pulses reflected from the meter disk;

c. empirically determining and expressing as an integer the number of pulses sensed by the sensor during a single rotation of said meter disk, wherein at least one of such pulses is genuine and the remainder of such pulses spurious;

d. counting down from said integer to "one" and then transmitting downstream a single electrical pulse representing one revolution of the meter disk; and e. repeating steps (a-d) above during each successive rotation of said meter disk.

12. A method according to claim 11, and including the step of shaping said pulse before the step of counting down from the integer to "one" for transforming input pulses of various signal strengths into shaped pulses having a pure high-low configuration satisfactory for the counting step.

13. A method according to claim 12, and including the step of dividing the number of pulses after the counting down from said integer to one step in order to reduce the number of pulses by an integral factor to reduce the downstream duty cycle frequency of the encoder.

14. A method according to claim 11, and including the step of lengthening the pulse to facilitate reliable activation of the pulse by a mechanical relay.

15. A method according to claim 11, wherein the step of directing light from a light source comprises directing light from a light emitting diode and the step of sensing information in the form of light pulses reflected from the meter disk comprises sensing the light with an infrared sensor.

* * * * *